United States Patent
Lu et al.

(10) Patent No.: US 7,811,411 B2
(45) Date of Patent: Oct. 12, 2010

(54) THERMAL MANAGEMENT OF INDUCTIVELY COUPLED PLASMA REACTORS

(75) Inventors: Siqing Lu, San Jose, CA (US); Qiwei Liang, Fremont, CA (US); Irene Chou, San Jose, CA (US); Steven H. Kim, Union City, CA (US); Young S. Lee, San Jose, CA (US); Ellie Y. Yieh, San Jose, CA (US); Muhammad M. Rasheed, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 490 days.

(21) Appl. No.: 11/200,431

(22) Filed: Aug. 9, 2005

(65) Prior Publication Data

US 2007/0034153 A1 Feb. 15, 2007

(51) Int. Cl.
*C23C 16/00* (2006.01)
*H01L 21/306* (2006.01)

(52) U.S. Cl. .............................. 156/345.48; 118/723 I; 118/723 AN

(58) Field of Classification Search ............... 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 5,571,366 A | * | 11/1996 | Ishii et al. ............... 156/345.26 |
| 5,763,851 A | * | 6/1998 | Forster et al. .......... 219/121.43 |
| 6,063,233 A | | 5/2000 | Collins et al. |
| 6,083,344 A | | 7/2000 | Hanawa et al. |
| 6,170,428 B1 | | 1/2001 | Redeker et al. |
| 6,182,602 B1 | | 2/2001 | Redeker et al. |
| 6,192,829 B1 | | 2/2001 | Karazim et al. |
| 6,286,451 B1 | | 9/2001 | Ishikawa et al. |
| 2003/0213434 A1 | | 11/2003 | Gondhalekar et al. |

OTHER PUBLICATIONS http://www.accuratus.com/boron.html, Accuratus Corporation, "Boron Nitride, BN", date unknown.*
D. Knightbridge: "Take the TEMA Test Heat Exchanger Selection" Process Engineering, Apr. 2005 pp. 20-21, XP008071777 UK; the whole document.

* cited by examiner

*Primary Examiner*—Luz L. Alejandro
(74) *Attorney, Agent, or Firm*—Townsend and Townsend and Crew

(57) ABSTRACT

An RF coil assembly provides a source to generate a plasma inductively in a process chamber. The RF coil assembly includes an RF coil disposed about a perimeter of the processing chamber and a frame disposed about a perimeter of the processing chamber. The frame is adapted to support the RF coil in position. An interface material is disposed between and in thermal contact with the frame and a sidewall of the processing chamber. The interface material has a thermal conductivity of 4.0 W/mK or greater.

15 Claims, 7 Drawing Sheets

THERMAL MANAGEMENT OF INDUCTIVELY COUPLED PLASMA REACTORS

BACKGROUND OF THE INVENTION

Chemical vapor deposition ("CVD") is a gas-reaction process used in the semiconductor industry to form thin layers or films of desired materials on a substrate. High-density-plasma CVD ("HDP-CVD") processes use a reactive chemical gas along with physical ion generation through the use of an RF generated plasma to enhance the film deposition. In particular, HDP-CVD systems form a plasma that is at least approximately two orders of magnitude greater than the density of a standard, capacitively coupled plasma CVD system by using an inductive coupling technique. In addition, HDP-CVD systems generally operate at lower pressure ranges than low-density plasma systems. The low chamber pressure employed in HDP-CVD systems provides active species having a long mean-free-path and reduced angular distribution. These factors, in combination with the higher plasma density, provide a processing environment that has advantages for certain types of semiconductor processing.

For instance, HDP-CVD techniques have been found to provide improved gapfill capabilities, in which gaps that separate circuit elements and interconnections on substrates are filled with electrically insulative material to prevent the introduction of spurious interactions between the elements. One reason for the improvement in such gapfill capability of HDP-CVD techniques is that they high density of the plasma promotes sputtering simultaneous with film deposition, slowing deposition on certain features, such as the corners of raised surfaces. Some HDP-CVD systems introduce flows of nonreactive gases into the plasma to further promote the sputtering effect and some processes use an electrode within a substrate support pedestal to generate an electric field that biases the plasma towards the substrate.

Recently, a number of processes have been developed that use $H_2$ as a source of the nonreactive gas, with the processes generally using high RF powers to generate the plasma and relatively long depositions times. While these processes have been very successful at filling gaps, they expose portions of the processing chamber to more extended periods of ion bombardment and radiation from high-power plasmas. The effect of this exposure is the absorption of a large amount of heat by ceramic components such as the chamber dome, baffle, gas nozzles, and process kit, particularly during multiple-wafer processes. This high temperature not only results in an increased breakage rate of these components, but may also adversely affect uniformity range drift and increase the incidence of nozzle clogging through the formation of reaction products at these sites.

There is accordingly a general need in the art for improved thermal management of inductively couple plasma reactors.

BRIEF SUMMARY OF THE INVENTION

Embodiments of the invention an RF coil assembly for providing a source to generate a plasma inductively in a process chamber. The RF coil assembly comprises an RF coil disposed about a perimeter of the processing chamber and a frame disposed about a perimeter of the processing chamber. The frame is adapted to support the RF coil in position. An interface material is disposed between and in thermal contact with the frame and a sidewall of the processing chamber. The interface material has a thermal conductivity of 3.0 W/mK or greater.

In different embodiments, the thermal conductivity of the interface material may be 4.0 W/mK or greater, 5.0 W/mK or greater, may be 6.0 W/mK or greater, or may be substantially between 3.0 and 6.0 W/mK. In some instances a coolant tube is disposed in thermal contact with the RF coil to carry a flow of liquid coolant.

The processing chamber may comprise a dome that defines an upper boundary of a plasma processing region within the processing chamber. The RF coil and the frame are disposed about the dome. In some such embodiments, the RF coil has a planar cross section defining an annulus around the dome, with the frame having a plurality of fingers extending in a direction outwards from the dome. The fingers cover a portion of the annulus such that a relative area of coverage of the annulus by the plurality of fingers is between 15% and 40%. In one embodiment, the relative area of coverage of the annulus by the plurality of fingers is between 20% and 30%. The plurality of fingers may comprise a plurality of pairs of fingers, with each pair of fingers being disposed on substantially opposite sides of the RF coil and covering substantially the same portion of the annulus. The annulus may be a substantially circular annulus. In a number of embodiments, the frame has a height that defines an area of thermal contact with the interface material, with the height being greater than a total width of the RF coil and fingers orthogonal to a plane of the planar cross section. In some such embodiments, the height is greater than the total width of the RF coil and fingers by at least 10%, while in other such embodiments the height is greater than the total width of the RF coil and fingers by at least 20%.

The RF coil assembly may form part of a substrate processing system that includes a housing, a high-density plasma generating system, a substrate holder, a gas-delivery system, a pressure-control system, and a controller. The housing defines the processing chamber. The high-density plasma generating system is operatively coupled to the processing chamber and comprises the RF coil assembly. The substrate holder is configured to hold a substrate during substrate processing. The gas-delivery system is configured to introduce gases into the processing chamber. The pressure-control system maintains a selected pressure within the processing chamber. The controller controls the high-density plasma generating system, the gas-delivery system, and the pressure-control system.

A further understanding of the nature and advantages of the present invention may be realized by reference to the remaining portions of the specification and the drawings.

BRIEF DESCRIPTION OF THE DRAWINGS

The file of this patent contains at least one drawings executed in color. Copies of this patent with color drawings will be provided by the Patent and Trademark Office upon request and payment of the necessary fee.

DETAILED DESCRIPTION OF THE INVENTION

Figure 1A:
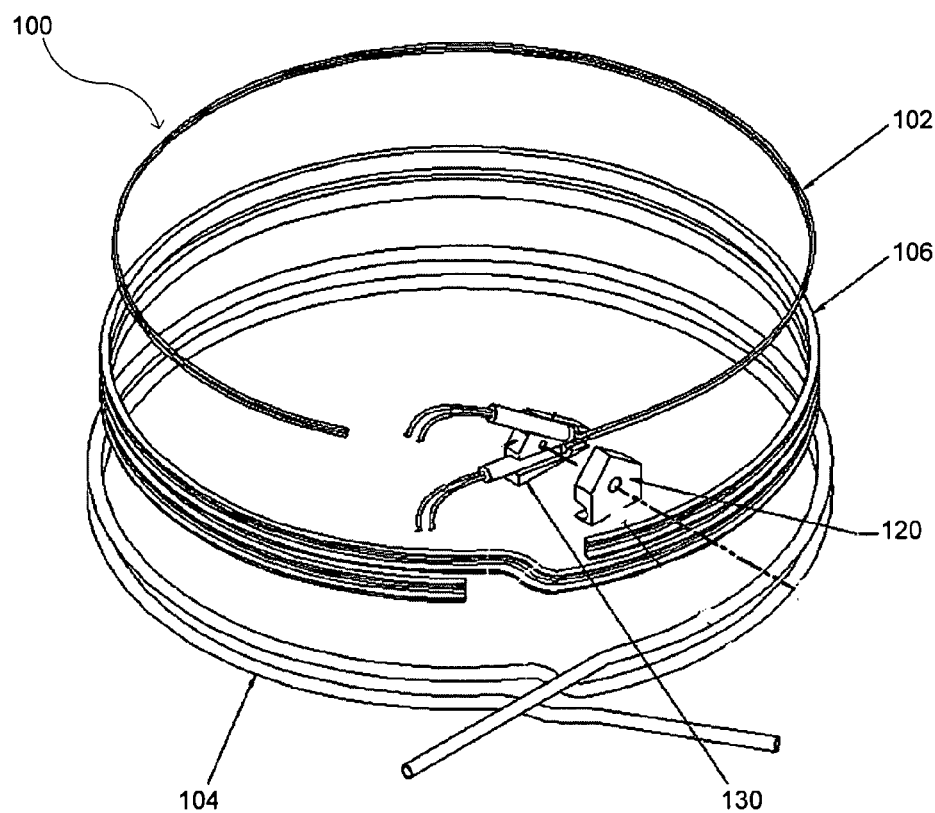
FIG. 1A provides an expanded view of a conventional RF side coil and heater assembly.
Figure 1B:
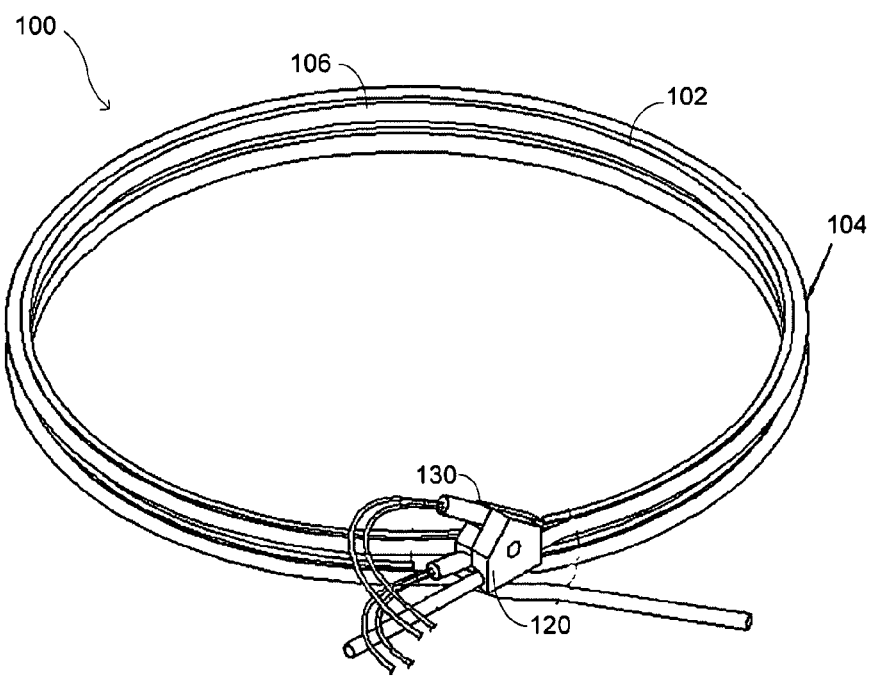
FIG. 1B provides an assembled view of the conventional RF side coil and heater assembly shown in FIG. 1A.

Embodiments of the invention provide improved thermal management of inductively coupled plasma reactors, particularly by controlling the thermal characteristics of side coils used in those reactors. FIGS. 1A and 1B respectively show expanded and assembled views of a conventional RF coil and heater assembly 100. The assembly has a heater 102 and an RF coil 104 concentrically aligned and coupled by a frame 106. The heater 102, RF coil 104, and frame 106 may also be coupled by an interconnect 120 and an assembly 130.

Figure 1C:
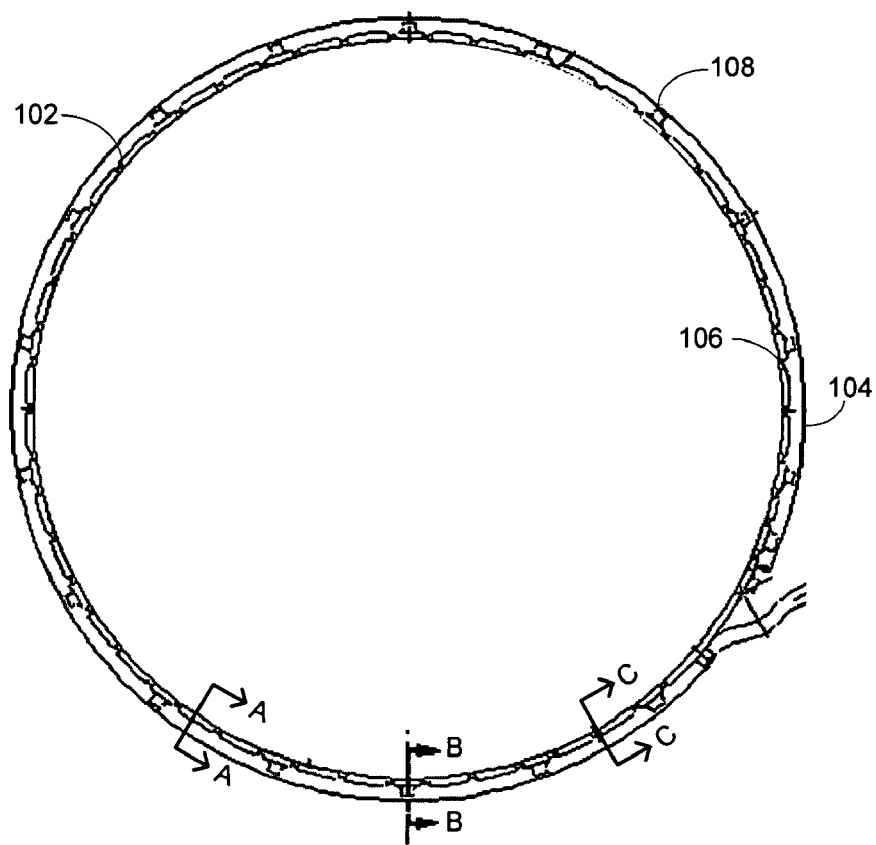
FIG. 1C provides a plan view of the conventional RF side coil and heater assembly shown in FIG. 1A.

FIG. 1C shows a plan view of the conventional RF coil and heater assembly 100, illustrating the concentric and coplanar alignment of the heater 102 and the RF coil 104. The RF coil 104 may be held in position relative to the heater 102 by the frame 106, which has fingers 108 that extend out and support the windings of the RF coil 104. The assembly 100 may be positioned around the outside of a dome sidewall, as described further below in connection with a description of an exemplary inductively coupled plasma system. The dome sidewall helps define the plasma generation space of a plasma chamber. In this configuration, the heater 102 is positioned closer to the dome sidewall than the RF coil 104. The heater 102 is also cooled with the dome sidewall when the RF coil 104 circulates cooling fluid to cool the plasma chamber.

Figure 1D:
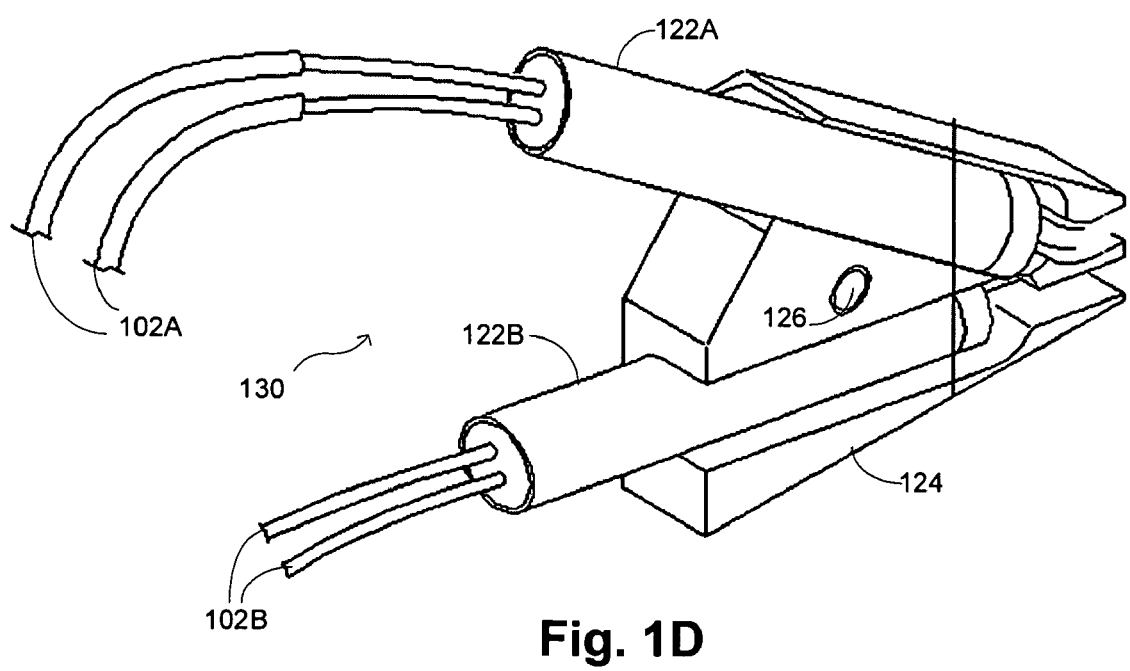
FIG. 1D provides a detailed view of the electrical connections of the heater in the conventional RF side coil and heater assembly shown in FIG. 1A.

A detailed view of the assembly 130 is shown in FIG. 1D, with conduits 122A and 122B being provided for connection to an AC power source (not shown). In the embodiment shown, the heater 102 comprises two pairs of wires with a first pair 102 located close to conduit 122A and a second pair 102B emerging from conduit 122B. A power-supply input (not shown) is connected to the first and second pairs 102A and 102B through a closed-loop temperature controller to regulate the temperature on the sidewall of the ceramic dome. The conduits 122A and 122B may be held in place by an electrical bracket 124, which may be secured to the rest of the assembly 100 by a fastener accepted at opening 126.

Figure 1E:
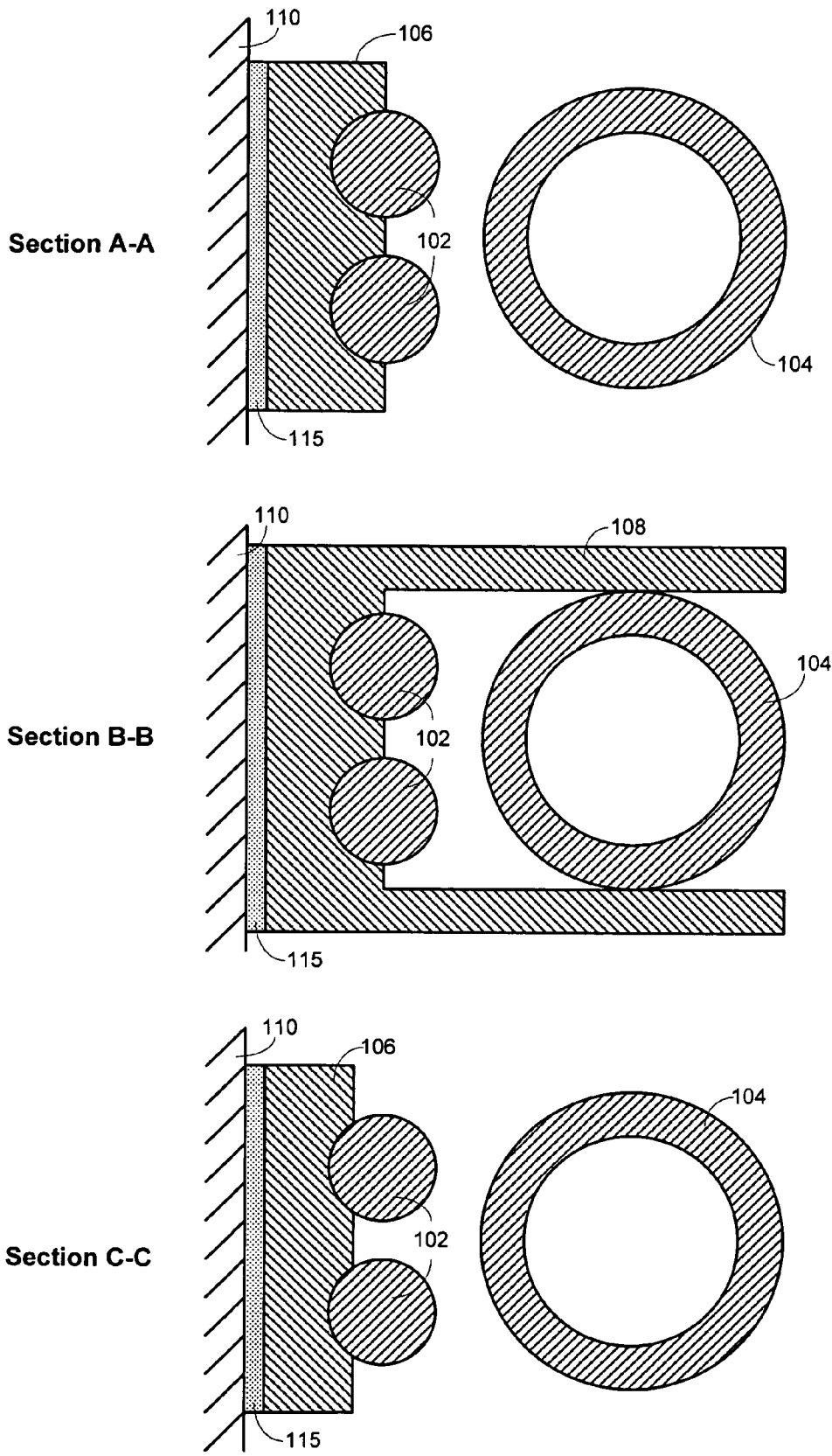
FIG. 1E provides cross-sectional views of the conventional RF side coil and heater assembly at the sections identified in FIG. 1C.

The structure of the conventional coil assembly is further illustrated with the cross-sectional views shown in FIG. 1E. Each of these cross-sectional views shows the position of the dome sidewall 110 relative to the heater 102 and RF coil 104. Section A-A at the top of the drawing shows a cross-sectional view of one turn of the assembly 100 at line A in FIG. 1C. Section B-B shows a cross-sectional view of the assembly 100 at line B in FIG. 1C where a finger 108 extends from the frame and contacts the RF coil 104. Section C-C shows another cross-sectional view of the assembly 100 at line C of FIG. 1C, with the frame 106 being thinner than the comparable portion of the frame 106 shown in section A-A. As seen in each of the cross-sectional views, an interface material 115 may be disposed between the dome sidewall 110 and the frame 106 to provide some heat loss. A coolant tube is provided through the coil 104, integrating the heater 102 and coolant tube with the RF coil. In this way, the dome may be heated by the heater 102 and cooled by flowing coolant through the coolant tube.

While the conventional side RF coil and heater assembly of FIGS. 1A-E is generally well designed for performing plasma processing in a chamber under certain processing conditions, limitations of the design are evident under processing conditions that use high RF powers and relatively long processing times. In particular, under processing conditions where the side RF power exceeds 7.5 kW, thermal management by the conventional design may be inadequate. This is even more true under processing conditions where the side RF power is 9.0 kW or greater. It is anticipated that processes requiring side RF powers greater than 12.0 kW may soon be needed to accommodate certain challenging deposition conditions. Also, certain processes are being developed where power levels of this order are to be maintained for periods of time greater than 200 s, greater than 300 s, greater than 400 s, or ever greater than 500 s, where depositions may prematurely fault at least in part because of the thermal characteristics of the conventional side RF coil design.

When the inventors were initially confronted with the task of modifying the side RF coil design to accommodate increased RF powers for increased periods of time, it was not apparent what types of modifications would achieve the desired thermal management. As evident from FIGS. 1A-E, the structure of the conventional side RF coil and heater includes several different components with structure that varies circumferentially about the structure. The thermal properties of the structure represent a complex interplay of thermal characteristics of the individual components. For example, in the conventional design, the use of fingers to thermally couple the coil and water tube reflects a design compromise between the competing design criteria of heating, cooling, and coil rigidity. As one method for decoupling the dependency of the various parameters and thereby systematically evaluating what types of modifications may be used to alter the thermal characteristics in the desired way, the inventors developed an electrical model of the thermal properties.

Figure 2A:
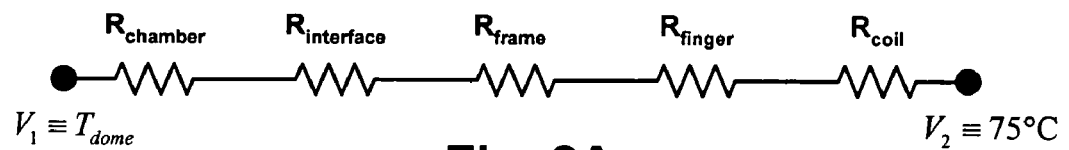
FIG. 2A is a schematic representation of an electrical heat-transfer model used in discussing embodiments of the invention.

This model is illustrated schematically in FIG. 2A with the voltage being analogous to the temperature. At one endpoint of the electrical model, the voltage $V_1$ corresponds to the dome temperature and at the other endpoint of the electrical model, the voltage $V_2$ corresponds to a temperature constraint of 75° C. imposed outside the coil. The current I in such an electrical model corresponds to the heat flux and may be approximately constant. Heat loss by each of several components of the arrangement corresponds to a resistive element in the electrical model, with the model shown in FIG. 2A explicitly indicating potential sources for changing the thermal model according to heat loss at the chamber $R_{chamber}$, heat loss through an interface material disposed between the dome sidewall and frame $R_{interface}$, heat loss through the frame $R_{frame}$, heat loss through fingers extending from the frame and disposed about the coil $R_{finger}$, and heat loss through the coil itself $R_{coil}$. In decoupling these different components, the model used by the inventors studies the overall affect on the thermal characteristics of the side-coil arrangement when thermal characteristics of one of the individual components is modified. This allows the effect of that component within the overall structure to be better understood and thereby allows combinations of effects to be understood. Basically, the objective of the modeling is to identify effective ways of reducing the resistances R in order to reduce the temperature.

Figure 2B:
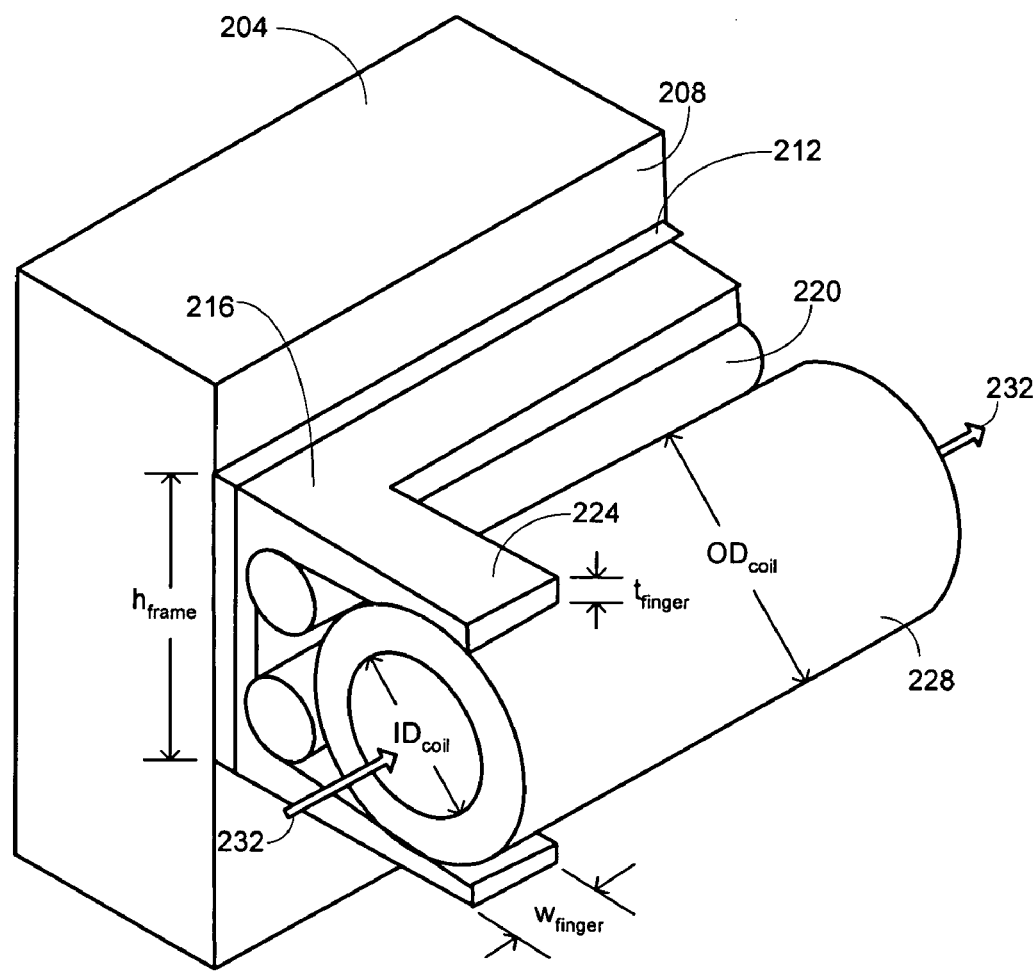
FIG. 2B is a schematic representation of a portion of a side-coil assembly used in discussing embodiments of the invention.

Embodiments of the invention provide a modification of the conventional design by changing thermal and other physical properties of the structure and the way it is used. FIG. 2B accordingly provides a schematic illustration of the structure of a portion of the side-coil arrangement, identifying certain elements and dimensions used in discussing embodiments of the invention below. The frame 216 is provided in thermal contact with the dome 204 at a sidewall 208 of the dome, with an interposing interface material 212. The frame has a height $h_{frame}$ and contacts the sidewall circumferentially. The heater elements are denoted 220 and the coil is denoted 228. The coil 228 has an outer diameter $OD_{coil}$ and an inner diameter $ID_{coil}$ and is configured with an internal coolant tube through which coolant may flow as identified by arrows 232. The frame 216 comprises a plurality of fingers 224 spaced circumferentially around the dome 204 and in thermal contact with the coil 228. A particular finger has a width $W_{finger}$ and a thickness $t_{finger}$, which as described further below may be substantially uniform for all fingers or may vary for different fingers.

In evaluating the effects of individual modifications of thermal characteristics, the inventors also employed a thermal model based on the standard Tubular Exchange Manufacturers Association ("TEMA") method for calculating heat-transfer coefficients. Because the two loops of the RF coil are approximately symmetric and because the construction of each loop has a repeatable pattern, only a section of a single coil structure was modeled. The models considered different types of coolants, one of which was 100% water and another of which was a 50% water/50% glycol mixture. In addition, the models considered different flow rates for the water/glycol mixture. These different coolants and flow rates affect the heat-transfer coefficients to be applied in modeling the coolant flow through the coil. The heat-transfer coefficients are fine-tuned by testing temperature data and fouling factor, with values that were used in some of the models being summarized in Table I:

TABLE I

Coolant Heat-Transfer Coefficients

| Parameter | 100% Water | Water/Glycol (High Flow) | Water/Glycol (Low Flow) |
|---|---|---|---|
| Tube Inner Diameter (cm) | 0.64516 | 0.64516 | 0.64516 |
| Tube Cross Section (m$^2$) | $3.269 \times 10^{-5}$ | $3.269 \times 10^{-5}$ | $3.269 \times 10^{-5}$ |
| Flow Rate (gpm) | 1.8 | 1.8 | 0.5 |
| Velocity (m/s) | 3.474 | 3.474 | 0.965 |
| Density (kg/m$^3$) | 999 | 1035 | 1035 |
| Viscosity (Pa s) | $3.70 \times 10^{-4}$ | $7.10 \times 10^{-4}$ | $7.10 \times 10^{-4}$ |
| Thermal Conductivity (W/mK) | 0.668 | 0.3674 | 0.3674 |
| Specific Heat (J/kg K) | 4190 | 3771 | 3771 |
| Prandtl Number Pr | 2.32 | 7.29 | 7.29 |
| Reynolds Number Re | $6.05 \times 10^4$ | $3.27 \times 10^4$ | $9.08 \times 10^3$ |
| Nusselt Number Nu | 224 | 193 | 69.2 |
| Heat-Transfer Coefficient (W/m$^2$K) | $2.32 \times 10^4$ | $1.10 \times 10^4$ | $3.94 \times 10^3$ |
| Fouling Factor (W/m$^2$K) | 2840 | 2840 | 2840 |
| Total Heat-Transfer Coefficient (W/m$^2$K) | $2.53 \times 10^3$ | $2.26 \times 10^3$ | $1.65 \times 10^3$ |

Figure 3:
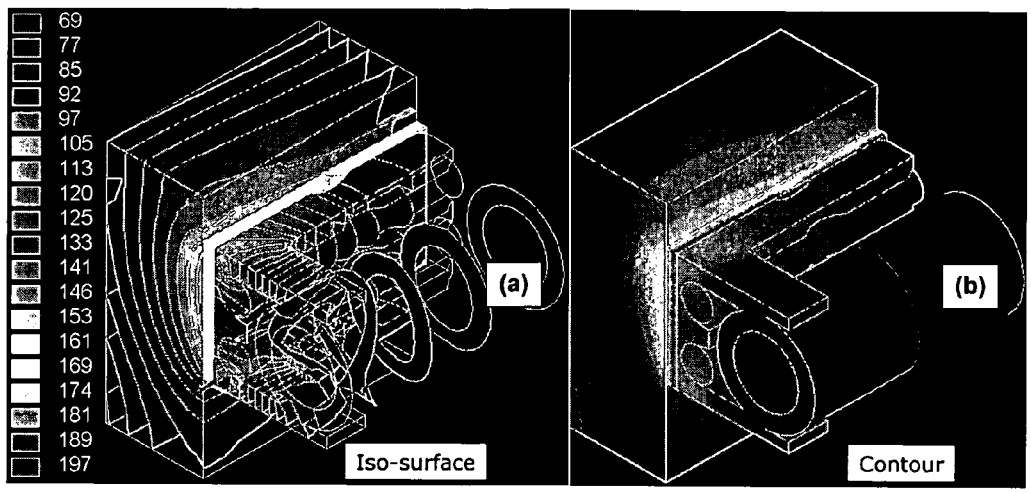
FIG. 3 provides simulation results of a thermal model of a portion of a conventional RF side coil (COLOR)

FIG. 3 shows the results of performing such a simulation using the geometry of a portion of the conventional side RF coil assembly described in connection with FIGS. 1A-1E. The simulations were performed for an side RF coil assembly operating with an inductive plasma chamber like the one described below in connection with FIGS. 5A and 5B under processing conditions that generate heat from a plasma formed by providing a 9 kW RF power to the side coil, in addition to providing a 9 kW power to the top coil, and a 6 kW bias power. The coolant tube was modeled as having a 1.8 gpm flow of 50% water/50% glycol at 50° C. The interface material disposed between the sidewall and the frame had a coefficient of thermal conductivity of about $\kappa=1.5$ W/mK, being modeled as a thermal-pad material marketed under the trade name HeatPath™ and commercially available from Dow Corning®. Part (a) of FIG. 3 shows isothermal surfaces determined by the simulation while part (b) of FIG. 3 provides a contour illustration of the resulting temperature determination.

These results are used as a baseline for comparison of average dome temperature changes of the coil when certain modifications are made. These comparisons are made with reference to FIG. 4, with panel (a) of that figure corresponding to panel (b) of FIG. 3 as the baseline results.

Figure 4:
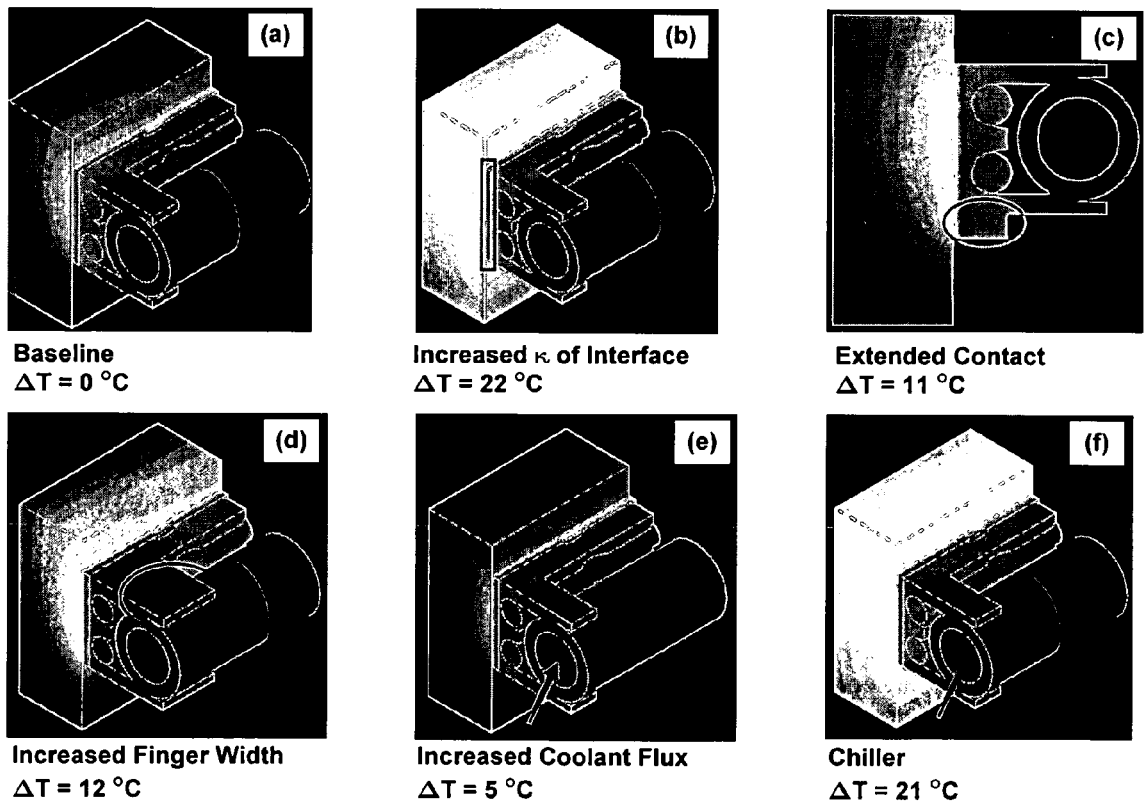
FIG. 4 provides simulation results of a thermal model to illustrate the effect of certain aspects of the invention (COLOR)

Part (b) of FIG. 4 shows the result of increasing the coefficient of thermal conductivity of the interface material 212 disposed between the sidewall 208 and the frame 216 to $\kappa=4.0$ W/mK. Such an increase in thermal conductivity causes an improvement in the thermal interface between the dome sidewall and the frame and results in a decrease in the average dome temperature by about 22° C. Different embodiments of the invention thus provide an interface material having a thermal conductivity of 3.0 W/mK or greater, 4.0 W/mK or greater, of 5.0 W/mK or greater, or of 6.0 W/mK or greater, such values sometimes being achieved by the use of materials having thermal conductivities within the range of 3.0-6.0 W/mK or within the range of 5.0-8.0 W/mK. A suitable material that may be used to provide an interface material having the desired characteristics in one specific embodiment is the flexible graphite material T-gon™ available from Thermagon, Inc. Such a material has a nominal thermal conductivity of 5 W/mK, with other physical parameters that characterize it including a density of 2.20 g/cm$^3$, a hardness of 85 Shore A, a volume resistivity of $11 \times 10^{-4}$ Ωcm, and a tensile strength of 650 psi.

Part (c) of FIG. 4 shows the result of increasing the thermal contact between the frame 216 and the dome sidewall 208, in this instance by increasing the area of contact between the frame 216 and the interface material 212 and between the interface material 212 and the dome sidewall 208. In the conventional design, the area of contact is equal to the product of (1) the circumference or perimeter of the dome 204 where the side coil assembly is mounted with (2) the height of the frame $h_{frame}$, which is in turn equal to the sum of the outer diameter of the coil $OD_{coil}$ and the thickness of the two fingers $2t_{finger}$. Embodiments of the invention increase the contact area, and therefore the thermal contact, by having the frame height $h_{frame}$ be greater than $OD_{coil}+2t_{finger}$. In some embodiments, the frame height $h_{frame}$ exceeds $OD_{coil}+2t_{finger}$ by more than 10% or by more than 20%, such as by being within a range of 10-25% greater or by being within a range of 20-30% greater.

In one conventional design of the side-coil assembly for a chamber that processes 300-mm diameter wafers, the height of the frame $h_{frame}$ is approximately 0.5 inches, with the dome having a circumference at that point of about 18.5 inches. The results shown in part (c) of FIG. 4 are a consequence of increasing the frame height $h_{frame}$ by about 0.07 inches, i.e. so that the frame height $h_{frame}$ exceeds $OD_{coil}+2t_{finger}$ by about 14%. In this illustration, the decrease in average dome temperature is about 11° C. Simulations performed by the inventors indicated that further temperature reductions may be realized by increasing the thermal contact between the frame 216 and the sidewall 208 still further.

Part (d) of FIG. 4 shows the result of increase the thermal contact between the frame 216 and the coil 228 by increasing the area of thermal contact between the fingers 224 of the frame 216 and the coil 228. In this instance, the baseline calculations of part (a) were performed for a portion of the side-coil assembly having a finger width $w_{finger}$ of 0.3 inches and a coil outer diameter $OD_{coil}$ of 0.65 inches, which are dimensions consistent with a conventional design having a dome circumference of about 18.5 inches. The simulations corresponding to part (d) were performed with a finger having twice the width, i.e. $w_{finger}$=0.6 inches, but with the same coil outer diameter. Increasing the thermal contact between the frame 216 and the coil 228 in this way results in a decrease in dome temperature of about 12° C.

More generally, the thermal contact between the frame 216 and the coil 228 may be increased by increasing the width of the fingers as illustrated by part (d), by increasing the number of fingers, or both; in some embodiments, the width of the fingers may vary as long as the total contact is increased. The level of contact may be defined in terms of the relative area defined by a cross section of the coil that is covered by the fingers 224 of the side-coil assembly. By such a definition, the relative area covered by the fingers is:

$$f = \frac{N_{fingers} OD_{coil} w_{finger}}{\pi[(R_{dome}+OD_{coil})^2 - R_{dome}^2]},$$

where the numerator is the total area of $N_{fingers}$ fingers and the denominator is the area of the annulus defined by the coil around a dome of radius $R_{dome}$. A conventional side-coil assembly for a chamber suitable for a 300-mm wafer has about 20 fingers for a dome with a radius of $R_{dome}$=18.5 inches, providing a relative area coverage f of about 10%. Embodiments of the invention provide coverage f of 15%-40%, with some embodiments more narrowly providing coverage f of 20%-30% to increase the thermal contact between the frame 216 and the coil 228.

While the above illustration for this quantitative measure of the relative coverage of the fingers discusses a planar coil cross section having the shape of a circular annulus, such a configuration is not intended to be limiting. More generally, the planar coil cross section may have any annular shape around a perimeter of the dome, such as an elliptical annular shape, a polygonal annular shape, or even an irregular annular shape. As used herein, an "annulus" is the region between two closed planar figures of geometrically similar shape but different sizes and having a common center.

Part (e) of FIG. 4 shows the result of increasing the flow rate of coolant, with a comparison being made between a baseline coolant flux of 2 gpm and an increase coolant flux of 4 gpm. While there is some temperature reduction at the dome as a consequence, it is more modest than some other designs, being about 5° C. The simulations performed by the inventors have thus determined generally that increases in coolant flux above 2 gpm may provide some but modest reductions in dome temperature. But at the same time, a reduction in flux below 2 gpm worsens the dome temperature significantly.

Part (f) of FIG. 4 shows the result of including a chiller to reduce the temperature of the coolant, achieving a reduction in the dome temperature of about 21° C.

The various simulations performed by the inventors, the results of some of which have been presented and discussed specifically above, have provided information about the relative effectiveness of these different designs. Generally, improvements in thermal contact between the dome sidewall and the frame, as achieved by use of an interface material having an increase coefficient of thermal conductivity or by increasing the area of contact between the frame and the interface material and between the interface material and the dome sidewall, and improvements in thermal contact between the frame and the coil, as achieved by use of larger average finger size, provide the most significant dome temperature reductions. While increases in coolant flow rates provide more modest effects, there is a minimum flow rate below which adverse thermal performance may result.

Exemplary Substrate Processing System

Figure 5A:
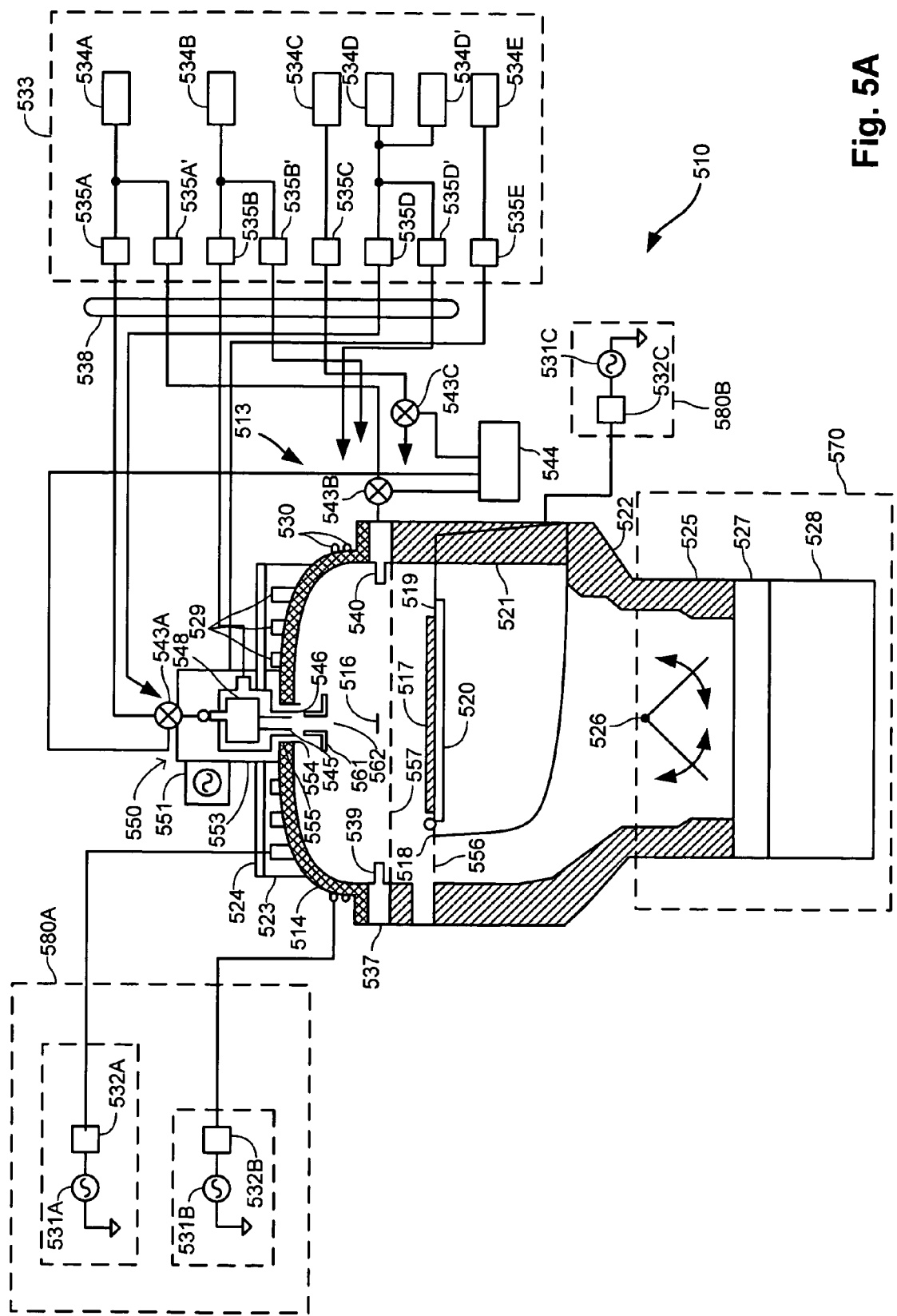
FIG. 5A is a simplified diagram of one embodiment of a high-density-plasma chemical-vapor-deposition system on which an RF side coil according to embodiments of the invention may be used.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the system is provided in connection with FIGS. 5A and 5B below. FIG. 5A schematically illustrates the structure of such an HDP-CVD system 510 in one embodiment. The system 510 includes a chamber 513, a vacuum system 570, a source plasma system 580A, a bias plasma system 580B, a gas delivery system 533, and a remote plasma cleaning system 550.

The upper portion of chamber 513 includes a dome 514, which is made of a ceramic dielectric material, such as aluminum oxide or aluminum nitride. Dome 514 defines an upper boundary of a plasma processing region 516. Plasma processing region 516 is bounded on the bottom by the upper surface of a substrate 517 and a substrate support member 518.

A heater plate 523 and a cold plate 524 surmount, and are thermally coupled to, dome 514. Heater plate 523 and cold plate 524 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 513 includes a body member 522, which joins the chamber to the vacuum system. A base portion 521 of substrate support member 518 is mounted on, and forms a continuous inner surface with, body member 522. Substrates are transferred into and out of chamber 513 by a robot blade (not shown) through an insertion/removal opening (not shown) in the side of chamber 513. Lift pins (not shown) are raised and then lowered under the control of a motor (also not shown) to move the substrate from the robot blade at an upper loading position 557 to a lower processing position 556 in which the substrate is placed on a substrate receiving portion 519 of substrate support member 518. Substrate receiving portion 519 includes an electrostatic chuck 520 that secures the substrate to substrate support member 518 during substrate processing. In a preferred embodiment, substrate support member 518 is made from an aluminum oxide or aluminum ceramic material.

Vacuum system 570 includes throttle body 525, which houses twin-blade throttle valve 526 and is attached to gate valve 527 and turbo-molecular pump 528. It should be noted that throttle body 525 offers minimum obstruction to gas flow, and allows symmetric pumping. Gate valve 527 can isolate pump 528 from throttle body 525, and can also control chamber pressure by restricting the exhaust flow capacity when throttle valve 526 is fully open. The arrangement of the throttle valve, gate valve, and turbo-molecular pump allow accurate and stable control of chamber pressures up to about 1 millitorr to about 2 torr.

The source plasma system 580A includes a top coil 529 and side coil 530, mounted on dome 514. A symmetrical ground shield (not shown) reduces electrical coupling between the coils. Top coil 529 is powered by top source RF (SRF) generator 531A, whereas side coil 530 is powered by side SRF generator 531B, allowing independent power levels and frequencies of operation for each coil. This dual coil system allows control of the radial ion density in chamber 513, thereby improving plasma uniformity. Side coil 530 and top coil 529 are typically inductively driven, which does not require a complimentary electrode. In embodiments of the invention, the side coil is included in a side-coil assembly having the characteristics discussed above. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 580B includes a bias RF ("BRF") generator 531C and a bias matching network 532C. The bias plasma system 580B capacitively couples substrate portion 517 to body member 522, which act as complimentary electrodes. The bias plasma system 580B serves to enhance the transport of plasma species (e.g., ions) created by the source plasma system 580A to the surface of the substrate.

RF generators 531A and 531B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 532A and 532B match the output impedance of generators 531A and 531B with their respective coils 529 and 530. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 5B:
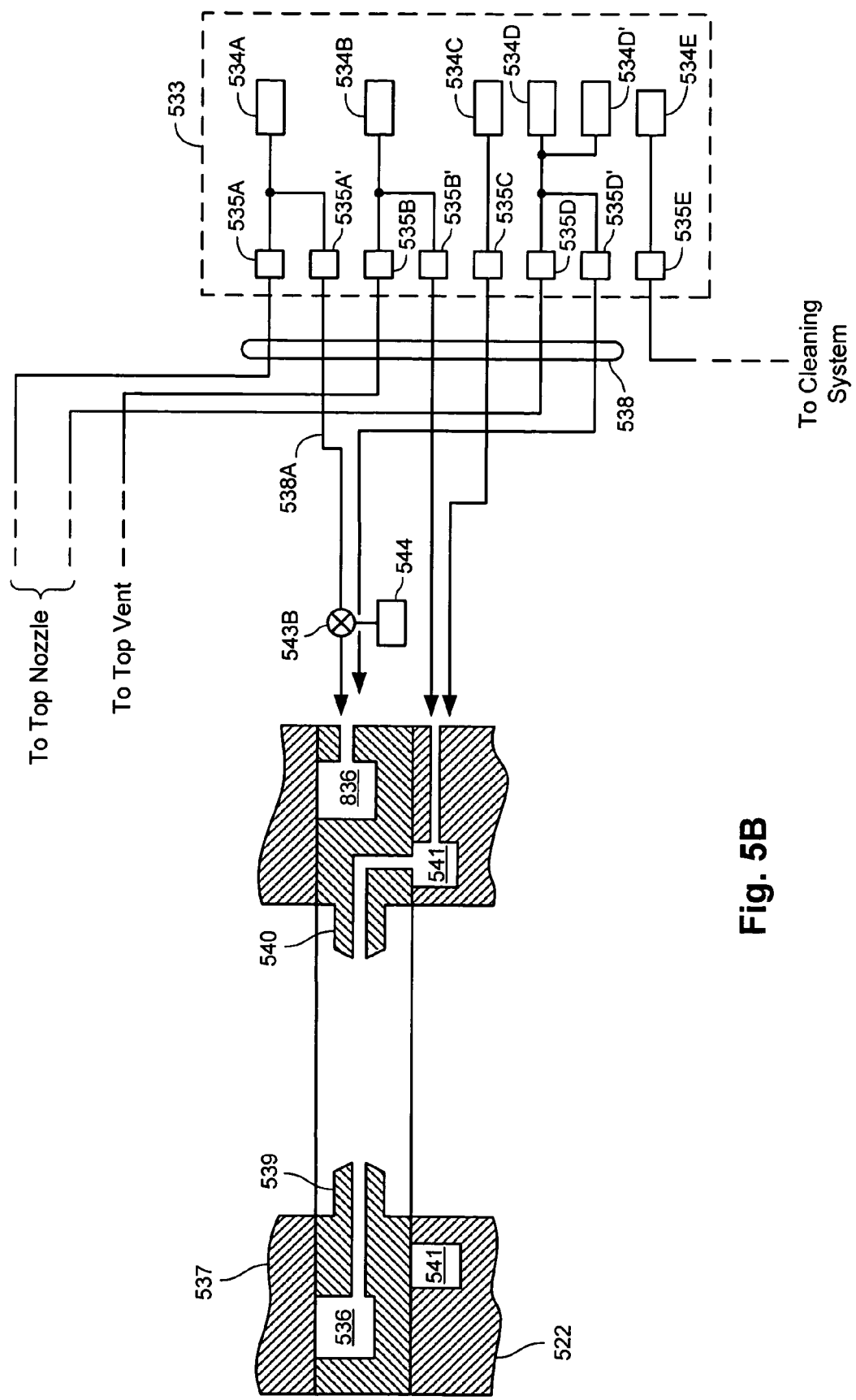
FIG. 5B is a simplified cross section of a gas ring that may be used in conjunction with the exemplary processing system of FIG. 5A.

A gas delivery system 533 provides gases from several sources, 534A-534E chamber for processing the substrate via gas delivery lines 538 (only some of which are shown). As would be understood by a person of skill in the art, the actual sources used for sources 534A-534E and the actual connection of delivery lines 538 to chamber 513 varies depending on the deposition and cleaning processes executed within chamber 513. Gases are introduced into chamber 513 through a gas ring 537 and/or a top nozzle 545. FIG. 5B is a simplified, partial cross-sectional view of chamber 513 showing additional details of gas ring 537.

In one embodiment, first and second gas sources, 534A and 534B, and first and second gas flow controllers, 535A' and 535B', provide gas to ring plenum 536 in gas ring 537 via gas delivery lines 538 (only some of which are shown). Gas ring 537 has a plurality of source gas nozzles 539 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 537 has 12 source gas nozzles made from an aluminum oxide ceramic.

Gas ring 537 also has a plurality of oxidizer gas nozzles 540 (only one of which is shown), which in a preferred embodiment are co-planar with and shorter than source gas nozzles 539, and in one embodiment receive gas from body plenum 541. In some embodiments it is desirable not to mix source gases and oxidizer gases before injecting the gases into chamber 513. In other embodiments, oxidizer gas and source gas may be mixed prior to injecting the gases into chamber 513 by providing apertures (not shown) between body plenum 541 and gas ring plenum 536. In one embodiment, third, fourth, and fifth gas sources, 534C, 534D, and 534D', and third and fourth gas flow controllers, 535C and 535D', provide gas to body plenum via gas delivery lines 538. Additional valves, such as 543B (other valves not shown), may shut off gas from the flow controllers to the chamber. In implementing certain embodiments of the invention, source 534A comprises a silane $SiH_4$ source, source 534B comprises a molecular oxygen $O_2$ source, source 534C comprises a silane $SiH_4$ source, source 534D comprises a helium He source, and source 534D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 543B, to isolate chamber 513 from delivery line 538A and to vent delivery line 538A to vacuum foreline 544, for example. As shown in FIG. 5A, other similar valves, such as 543A and 543C, may be incorporated on other gas delivery lines. Such three-way valves may be placed as close to chamber 513 as practical, to minimize the volume of the unvented gas delivery line (between the three-way valve and the chamber).

Additionally, two-way (on-off) valves (not shown) may be placed between a mass flow controller ("MFC") and the chamber or between a gas source and an MFC.

Referring again to FIG. 5A, chamber 513 also has top nozzle 545 and top vent 546. Top nozzle 545 and top vent 546 allow independent control of top and side flows of the gases, which improves film uniformity and allows fine adjustment of the film's deposition and doping parameters. Top vent 546 is an annular opening around top nozzle 545. In one embodiment, first gas source 534A supplies source gas nozzles 539 and top nozzle 545. Source nozzle MFC 535A' controls the amount of gas delivered to source gas nozzles 539 and top nozzle MFC 535A controls the amount of gas delivered to top gas nozzle 545. Similarly, two MFCs 535B and 535B' may be used to control the flow of oxygen to both top vent 546 and oxidizer gas nozzles 540 from a single source of oxygen, such as source 534B. In some embodiments, oxygen is not supplied to the chamber from any side nozzles. The gases supplied to top nozzle 545 and top vent 546 may be kept separate prior to flowing the gases into chamber 513, or the gases may be mixed in top plenum 548 before they flow into chamber 513. Separate sources of the same gas may be used to supply various portions of the chamber.

A remote microwave-generated plasma cleaning system 550 is provided to periodically clean deposition residues from chamber components. The cleaning system includes a remote microwave generator 551 that creates a plasma from a cleaning gas source 534E (e.g., molecular fluorine, nitrogen trifluoride, other fluorocarbons or equivalents) in reactor cavity 553. The reactive species resulting from this plasma are conveyed to chamber 513 through cleaning gas feed port 554 via applicator tube 555. The materials used to contain the cleaning plasma (e.g., cavity 553 and applicator tube 555) must be resistant to attack by the plasma. The distance between reactor cavity 553 and feed port 554 should be kept as short as practical, since the concentration of desirable plasma species may decline with distance from reactor cavity 553. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 520, do not need to be covered with a dummy wafer or otherwise protected, as may be required with an in situ plasma cleaning process. In FIG. 5A, the plasma-cleaning system 550 is shown disposed above the chamber 513, although other positions may alternatively be used.

A baffle 561 may be provided proximate the top nozzle to direct flows of source gases supplied through the top nozzle into the chamber and to direct flows of remotely generated plasma. Source gases provided through top nozzle 545 are directed through a central passage 562 into the chamber, while remotely generated plasma species provided through the cleaning gas feed port 554 are directed to the sides of the chamber 513 by the baffle 561.

Those of ordinary skill in the art will realize that specific parameters can vary for different processing chambers and different processing conditions, without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. An RF coil assembly for providing a source to generate a plasma inductively in a processing chamber, the RF coil assembly comprising:
   an RF coil disposed about a side perimeter of the processing chamber;
   a frame disposed about the side perimeter of the processing chamber and adapted to support the RF coil in position, the frame including a plurality of fingers extending outward from the processing chamber in a first direction and disposed on each side of the RF coil, wherein first fingers of the plurality of fingers are disposed on a first side of the RF coil and second fingers of the plurality of fingers are disposed on a second side of the RF coil, the frame also including a base extending between the plurality of fingers and a first portion extending beyond the first fingers in a second direction substantially perpendicular to the first direction, the frame having a planar cross section characterized by the base extending in the second direction between a first finger and a second finger disposed on substantially opposite sides of the RF coil and the first portion extending beyond the first finger in the second direction; and
   an interface material disposed between and in thermal contact with the frame and a sidewall of the processing chamber, the interface material having a thermal conductivity of 3.0 W/mK or greater, wherein a height of the frame includes a height of the base and a height of the first portion and defines an area of thermal contact with the interface material, the height of the frame being greater than a total width of the RF coil, the first finger, and the second finger as measured in the second direction along the planar cross section of the frame.

2. The RF coil assembly recited in claim 1 wherein the thermal conductivity of the interface material is 4.0 W/mK or greater.

3. The RF coil assembly recited in claim 1 further comprising a coolant tube disposed in thermal contact with the RF coil to carry a flow of liquid coolant.

4. The RF coil assembly recited in claim 1 wherein:
   the processing chamber comprises a dome that defines an upper boundary of a plasma processing region within the processing chamber; and
   the RF coil and the frame are disposed about the dome.

5. The RF coil assembly recited in claim 4 wherein:
   the RF coil has a planar cross section defining an annulus around the dome, and the plurality of fingers extend in the first direction outwards from the dome to cover a portion of the annulus such that a relative area of coverage of the annulus by the plurality of fingers is between 15% and 40%.

6. The RF coil assembly recited in claim 5 wherein the relative area of coverage of the annulus by the plurality of fingers is between 20% and 30%.

7. The RF coil assembly recited in claim 5 wherein the plurality of fingers comprises a plurality of pairs of fingers, each such pair of fingers being disposed on substantially opposite sides of the RF coil and covering substantially the same portion of the annulus.

8. The RF coil assembly recited in claim 5 wherein the annulus is a substantially circular annulus.

9. The RF coil assembly recited in claim 1 wherein the height of the frame is greater than the total width of the RF coil, the first finger, and the second finger by at least 10%.

10. The RF coil assembly recited in claim 1 wherein the height of the frame is greater than the total width of the RF coil, the first finger, and the second finger by at least 20%.

11. An RF coil assembly for providing a source to generate a plasma inductively in a processing chamber, the processing chamber comprising a dome that defines an upper boundary of a plasma processing region within the processing chamber, the RF coil assembly comprising:
 an RF coil disposed about a side perimeter of the dome and having a planar cross section defining an annulus around the dome within a plane;
 a frame disposed about the side perimeter of the dome and adapted to support the RF coil in position, the frame having a plurality of fingers extending in a first direction outwards from the dome to cover a portion of the annulus such that a relative area of coverage of the annulus by the plurality of fingers is between 15% and 40%, the frame including a base extending between the plurality of fingers and a first portion extending beyond the plurality of fingers in a second direction substantially perpendicular to the first direction, the frame having a planar cross section characterized by the base extending in the second direction between a first finger and a second finger disposed on substantially opposite sides of the RF coil and the first portion extending beyond the first finger in the second direction;
 an interface material disposed between and in thermal contact with the frame and a sidewall of the dome, the interface material having a thermal conductivity of 3.0 W/mK or greater and having a height that defines an area of thermal contact with the frame, wherein the height of the interface material is greater than a total width of the RF coil, the first finger, and the second finger as measured in the second direction along the planar cross section of the frame; and
 a coolant tube disposed in thermal contact with the RF coil to carry a flow of liquid coolant.

12. The RF coil assembly recited in claim 11 wherein the plurality of fingers comprises a plurality of pairs of fingers, each such pair of fingers being disposed on substantially opposite sides of the RF coil and covering substantially the same portion of the annulus.

13. A substrate processing system comprising:
 a housing defining a processing chamber;
 a high-density plasma generating system operatively coupled to the processing chamber, the high-density plasma generating system comprising:
  an RF coil disposed about a side perimeter of the processing chamber;
  a frame disposed about the side perimeter of the processing chamber and adapted to support the RF coil in position, the frame including a plurality of fingers extending outward from the processing chamber in a first direction and disposed on each side of the RF coil, wherein first fingers of the plurality of fingers are disposed on a first side of the RF coil and second fingers of the plurality of fingers are disposed on a second side of the RF coil, the frame also including a base extending between the plurality of fingers and a first portion extending beyond the first fingers in a second direction substantially perpendicular to the first direction, the frame having a planar cross section characterized by the base extending in the second direction between a first finger and a second finger disposed on substantially opposite sides of the RF coil and the first portion extending beyond the first finger in the second direction; and
  an interface material disposed between and in thermal contact with the frame and a sidewall of the processing chamber, the interface material having a thermal conductivity of 3.0 W/mK or greater, wherein a height of the frame includes a height of the base and a height of the first portion and defines an area of thermal contact with the interface material, the height of the frame being greater than a total width of the RF coil, the first finger, and the second finger as measured in the second direction along the planar cross section of the frame by at least 10%;
 a substrate holder configured to hold a substrate during substrate processing;
 a gas-delivery system configured to introduce gases into the processing chamber;
 a pressure-control system for maintaining a selected pressure within the processing chamber; and
 a controller for controlling the high-density plasma generating system, the gas-delivery system, and the pressure-control system.

14. The substrate processing system recited in claim 13 wherein:
 the processing chamber comprises a dome that defines an upper boundary of a plasma processing region within the processing chamber;
 the RF coil and the frame are disposed about the dome;
 the RF coil has a planar cross section defining an annulus around the dome, and the plurality of fingers extend in the first direction outwards from the dome to cover a portion of the annulus such that a relative area of coverage of the annulus by the plurality of fingers is between 15% and 40%.

15. The substrate processing system recited in claim 14 wherein the plurality of fingers comprises a plurality of pairs of fingers, each such pair of fingers being disposed on substantially opposite sides of the RF coil and covering substantially the same portion of the annulus.

* * * * *